(12) United States Patent
Nishiguchi

(10) Patent No.: US 9,099,435 B2
(45) Date of Patent: Aug. 4, 2015

(54) METHOD OF MANUFACTURING SEMICONDUCTOR DEVICE

(71) Applicant: KABUSHIKI KAISHA TOSHIBA, Tokyo (JP)

(72) Inventor: Toshifumi Nishiguchi, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,366

(22) Filed: Feb. 28, 2014

(65) Prior Publication Data

US 2015/0079758 A1 Mar. 19, 2015

(30) Foreign Application Priority Data

Sep. 13, 2013 (JP) .................................. 2013-191139

(51) Int. Cl.
*H01L 21/76* (2006.01)
*H01L 29/40* (2006.01)
*H01L 21/265* (2006.01)
*H01L 21/02* (2006.01)

(52) U.S. Cl.
CPC ........ *H01L 29/407* (2013.01); *H01L 21/02271* (2013.01); *H01L 21/26586* (2013.01)

(58) Field of Classification Search
CPC .... H01L 29/402; H01L 29/405; H01L 29/407
USPC .......... 438/243, 420–437, 444–454, 618–672
See application file for complete search history.

(56) References Cited

U.S. PATENT DOCUMENTS 5,970,356 A * 10/1999 Jeon ............................. 438/361
2010/0224932 A1 * 9/2010 Takaya et al. ................ 257/330

FOREIGN PATENT DOCUMENTS

JP 2009212172 A 9/2009

* cited by examiner

*Primary Examiner* — Brook Kebede
(74) *Attorney, Agent, or Firm* — Patterson & Sheridan, LLP

(57) ABSTRACT

A method of manufacturing a semiconductor device includes forming trenches in a first conductivity type semiconductor layer. An insulating film is then formed to cover the inner surfaces of the trenches. A part of the insulating film which is covering a bottom part of the trenches is removed from at least a portion of the trenches. Dopant ions are implanted into regions of the semiconductor layer that are below the bottom parts of that portion of the trenches from which the portion of the insulating film has been removed.

18 Claims, 5 Drawing Sheets

US 9,099,435 B2

METHOD OF MANUFACTURING SEMICONDUCTOR DEVICE

CROSS-REFERENCE TO RELATED APPLICATION

This application is based upon and claims the benefit of priority from Japanese Patent Application No. 2013-191139, filed Sep. 13, 2013, the entire contents of which are incorporated herein by reference.

FIELD

Embodiments described herein relate generally to a method of manufacturing a semiconductor device.

BACKGROUND

Semiconductor devices for power control are required to have a high source-drain breakdown voltage and a low on-state resistance. For example, a metal oxide semiconductor (MOS) type transistor adopts a trench gate structure to facilitate miniaturization thereof while providing a low on-state resistance. The source-drain breakdown voltage can be increased by using a guard ring structure to terminate an end portion of a transistor structure. However, the miniaturization the structure requires improvements in the structure and the manufacturing method thereof.

DETAILED DESCRIPTION

Figure 1A:
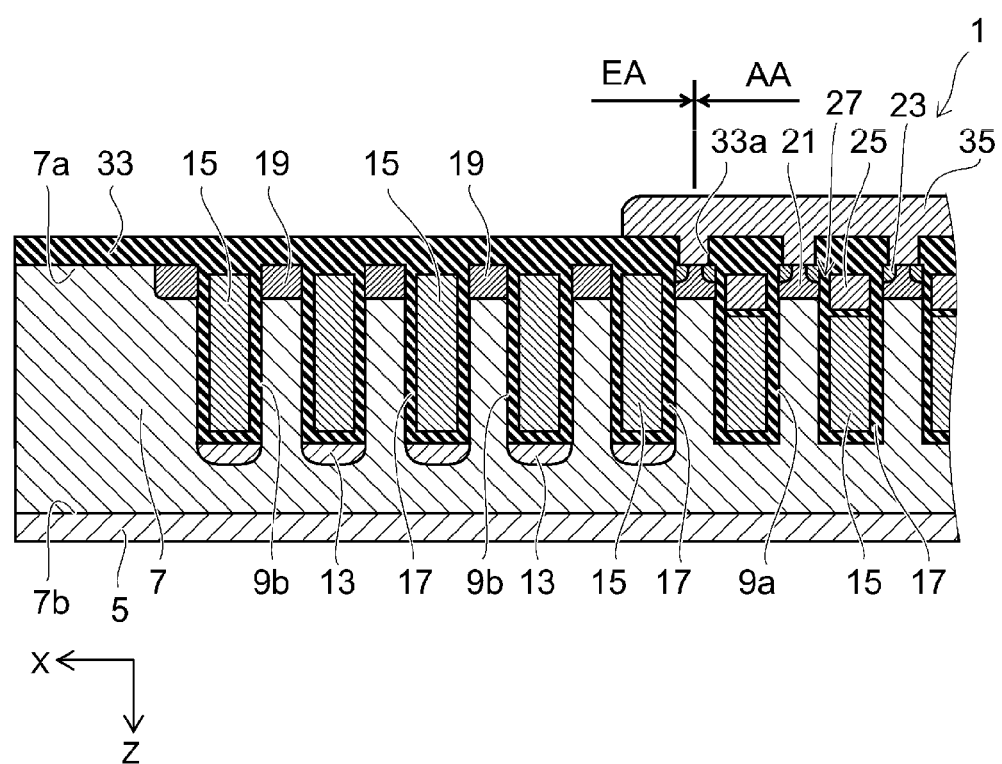
FIGS. 1A and 1B are schematic views depicting a semiconductor device according to an embodiment.

According to exemplary embodiments there is provided a method of manufacturing a semiconductor device capable of improving breakdown voltage of a terminal portion in response to miniaturization of an element structure.

An embodiment provides a method for manufacturing a semiconductor device. A plurality of trenches is formed in a first semiconductor layer of a first conductivity type. An insulating film is formed on the trenches so as to cover trench surfaces including a bottom part of each trench. The insulating film may be, for example, formed in a conformal manner using a chemical vapor deposition process or similar technique. Thermal oxidation techniques may also be used, for example, when the first semiconductor layer is a silicon layer. A part of the insulating film that is formed on a bottom part of the trenches is removed from at least a portion of the plurality of trenches. For example, trenches formed in a terminal region of the semiconductor device surrounding an active element region may comprise the portion of trenches from which the insulating film is removed from the bottom parts thereof. The insulating film may be selectively removed from bottom parts of the trenches using an anisotropic reactive ion etch process, for example. After removing the insulating film from the bottom surfaces of at least a portion of the trenches dopant ions are implanted into regions of the first semiconductor layer beneath the bottom parts of the trenches from which the insulating film was removed.

In general, according to one exemplary embodiment, there is provided a method of manufacturing a semiconductor device including an element portion in which semiconductor elements are provided, and a terminal portion which surrounds the element portion, the method including forming a plurality of trenches extending in a direction from a first surface of a first conductivity type semiconductor layer in which the semiconductor elements are formed to a second surface opposite to the first surface; forming an insulating film covering the first surface and inner surfaces of the plurality of trenches; removing a part of the insulating film which is formed on bottom surfaces of the trenches positioned in the terminal portion among the plurality of trenches; and implanting second conductivity type dopant ions into bottom portions of the trenches from which a part of the insulating film is removed.

Hereinafter, embodiments will be described with reference to the drawings. In each of the drawings, the same reference numerals are attached to the same or substantial similar portions, and the detailed description thereof may be omitted rather than repeated in connection with subsequent instances, so that differences between the various embodiments maybe described. It should be noted that the drawings are schematic or conceptual, therefore the relationships between the depicted thickness and width of each portion/element to actual sizes and the ratio depicted sizes among the portions/elements, are not necessarily the same as the actual values thereof. Furthermore, the dimensions and the proportions, even for identical portions/elements, may be shown differently depending on the drawings.

Figure 1B:
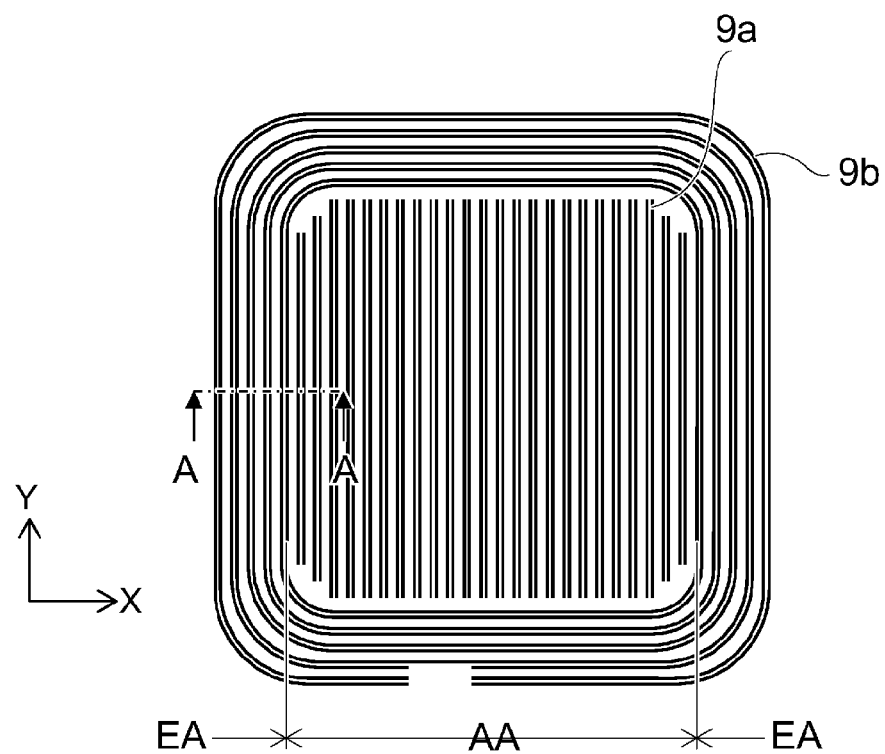

FIGS. 1A and 1B are schematic views showing a semiconductor device 1 according to an embodiment of the present disclosure. The semiconductor device 1 is, in this example, a MOS transistor having a trench gate structure. FIG. 1A shows a cross-sectional view taken along the line A-A shown in FIG. 1B. FIG. 1B is a plan view showing an arrangement of trenches provided on a chip surface.

The semiconductor device 1 includes an element portion AA (e.g., an active area) in which semiconductor elements (MOS transistors) are provided, and a terminal portion EA which surrounds the element portion.

As shown in FIG. 1A, the semiconductor device 1 includes a drain layer 5, and a drift layer 7 provided on the drain layer 5. The drain layer 5 is, for example, an n-type semiconductor layer provided on a silicon substrate. In addition, the drain layer 5 may be an n-type silicon layer or an n-type silicon substrate itself. The drift layer 7 provided on the drain layer 5 is an n-type semiconductor layer having a lower dopant concentration than that of the drain layer 5. The drift layer 7 is, for example, an n-type silicon layer.

Although a first conductivity type is referred to in this example as an n-type, and a second conductivity type is referred to as a p-type, the present disclosure is not limited to this arrangement. The first conductivity type may be a p-type and the second conductivity type may be an n-type. Further, the semiconductor layer is not limited to a silicon layer, and may be, for example, silicon carbide (SiC) or other materials.

As shown in FIG. 1A, trenches 9a and trenches 9b are formed in the drift layer 7. Each trench is provided extending in a direction (Z direction) from an upper surface 7a of the drift layer 7 to a lower surface 7b. As shown in FIG. 1B, the trenches 9a are provided in the element portion AA and the trenches 9b are provided in the terminal portion EA.

As shown in FIG. 1B, trenches 9a extend, for example, in a Y direction within the element portion AA. On the other hand, the trenches 9b are provided in the terminal portion EA so as to surround the element portion AA—that is, trenches 9b may have portions extending in the Y direction and portions extending in the X direction. In addition, as also shown in FIG. 1B, the trenches 9b are preferably formed as a plurality of trenches 9B (that is, for example, distinct rings rather than a continuous spiral). When it is desired to make the depth of the trenches 9b in the terminal portion EA deeper than the depth of the trenches 9a in the element portion AA, this may be realized by increasing a width of the trench opening. In addition, when it is desired to make the depth of the trench opening in the terminal portion EA shallower, this may be realized by narrowing the width of the trench opening. Hence, by control of the width of the trench openings in the terminal portion, the depth of the trenches 9b may be adjusted.

Inside the trenches 9a and 9b, a field plate electrode 15 is provided. The field plate electrode 15 faces the drift layer 7 via an insulating film 17. Within the trenches 9a, a gate electrode 25 is provided above the field plate electrode 15 via the insulating film.

A p-type region 19 is provided on the drift layer 7 positioned between adjacent trenches 9b in the terminal portion EA. A p-type base layer 21 is provided on the drift layer 7 positioned between adjacent trenches 9a in the element portion AA. The p-type base layer 21 faces the gate electrode 25 via a gate insulating film 27. Further, an n-type source region 23 is provided on the p-type base layer 21.

On the trenches 9a and 9b, an interlayer insulating film 33 is provided. The interlayer insulating film 33 covers the gate electrode 25 and the field plate electrode 15 in trenches 9a and the field plate electrode 15 in trenches 9b. The interlayer insulating film 33 has an opening 33a within the element portion AA that is positioned above the p-type base layer 21 and the n-type source region 23.

Further, a source electrode 35 is provided on the interlayer insulating film 33 in the element portion AA. The source electrode 35 is electrically connected to the p-type base layer 21 and the n-type source region 23 via the opening 33a.

In the terminal portion EA, p-type regions 13 are formed under each of the trenches 9b. The p-type region 13 limits spreading of a depletion layer in a horizontal direction (X direction) inside the drift layer 7 in a source-drain off-state to improve breakdown voltage of the terminal portion.

That is, a guard ring is provided with the trenches 9b, in that the p-type regions 13 are formed under each trench 9b in the semiconductor device 1. Due to this, drain breakdown voltage and avalanche resistance may be improved.

Next, with reference to FIGS. 2A to 3C, a method of manufacturing a semiconductor device according to an embodiment will be described. FIGS. 2A to 3C are schematic cross-sectional views depicting processes for manufacturing the semiconductor device according to the embodiment.

For example, a wafer in which the n-type drift layer 7 has been formed on a silicon substrate (not specifically depicted) is prepared. The n-type drift layer 7 has a first surface (upper surface 7a) and a second surface (lower surface 7b) opposite to the first surface.

Figure 2A:
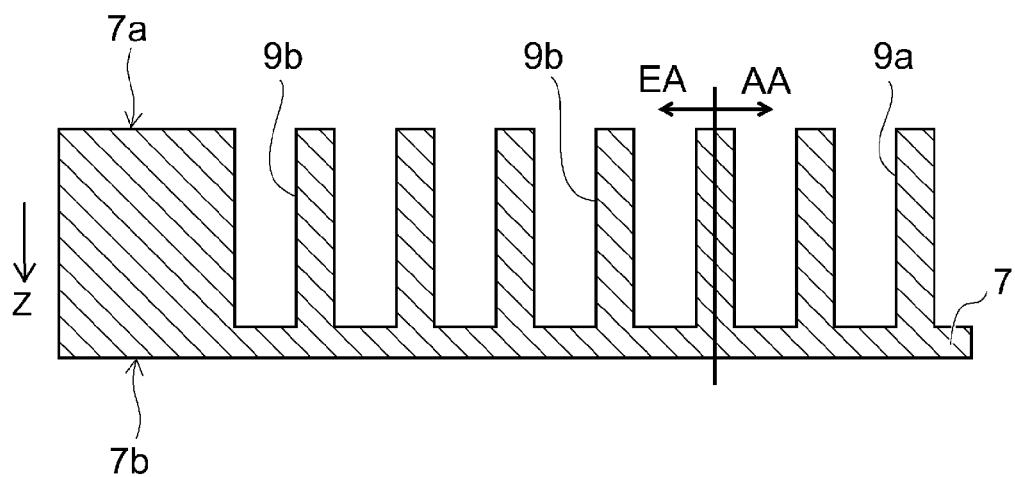
FIGS. 2A to 2C are schematic cross-sectional views depicting processes for manufacturing a semiconductor device according to the embodiment.

As shown in FIG. 2A, the trenches 9a and 9b extending in a first direction (Z direction) from the upper surface 7a of the n-type drift layer 7 to the lower surface 7b are formed. The trenches 9a are formed in a region corresponding to the element portion AA, and the trenches 9b are formed in a region corresponding to the terminal portion EA, which surrounds the element portion AA.

The trenches 9a and 9b are formed by, for example, using a etch mask provided with an opening corresponding to the intended position of each trench on the n-type drift layer 7 and selectively etching the n-type drift layer 7 through the etch mask using an anisotropic reactive ion etching (RIE) method.

Figure 2B:
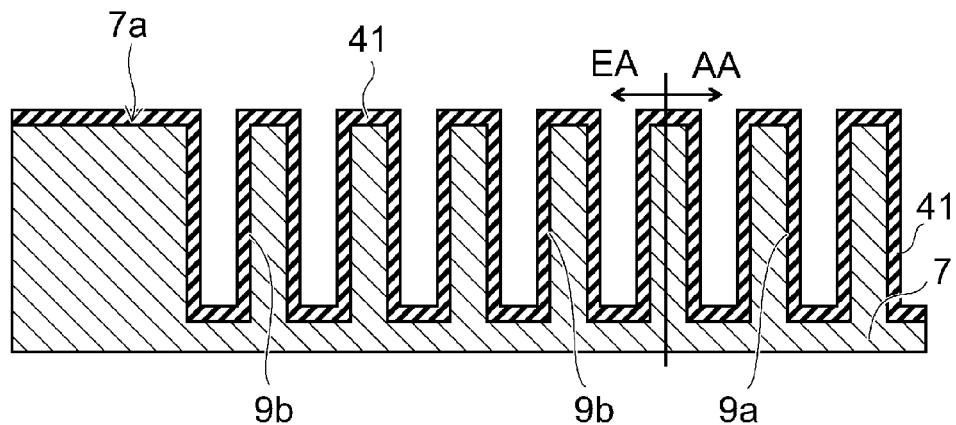

Subsequently, as shown in FIG. 2B, an insulating film 41 which covers the upper surface 7a of the n-type drift layer 7 and inner surfaces of the trenches 9a and 9b is formed. The insulating film 41 is, for example, a silicon oxide film formed by thermally oxidizing the n-type drift layer 7. The insulating film 41 is formed with a thickness of, for example, 10 nanometers (nm) to 200 nm. Preferably, the insulating film is formed with a thickness in which etching damage formed on the inner surfaces of the trenches 9a and 9b during etching may be removed or otherwise compensated for.

Figure 2C:
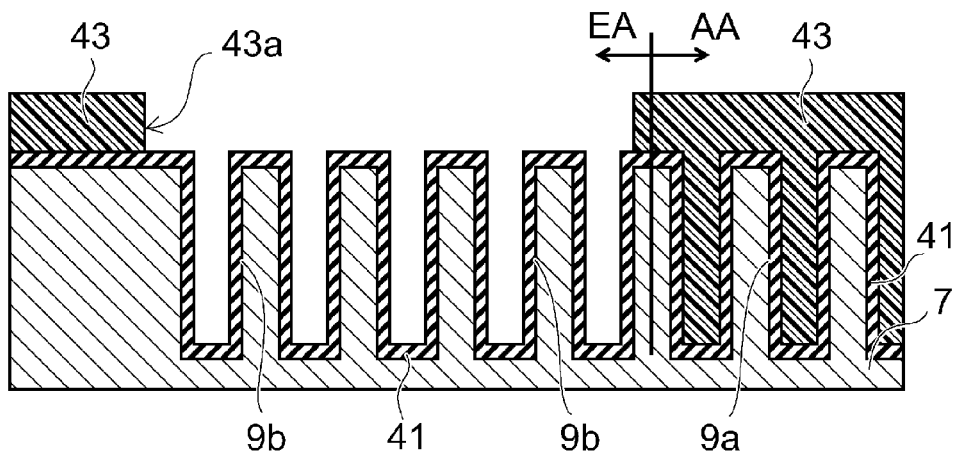

Next, as shown in FIG. 2C, a mask 43 which covers the element portion AA and the outside of the terminal portion EA is formed. The mask 43 is, for example, a photoresist and has an opening 43a formed by photolithography. Inside the opening 43a, the trenches 9b in the terminal portion EA are exposed. The mask 43 is embedded (filled) into the trench 9a and covers the upper surface 7a of the n-type drift layer 7. The mask 43 is formed with a thickness at which a p-type dopant is not implanted into the upper surface 7a of the n-type drift layer 7 during an ion implantation process which will be more fully described later.

Figure 3A:
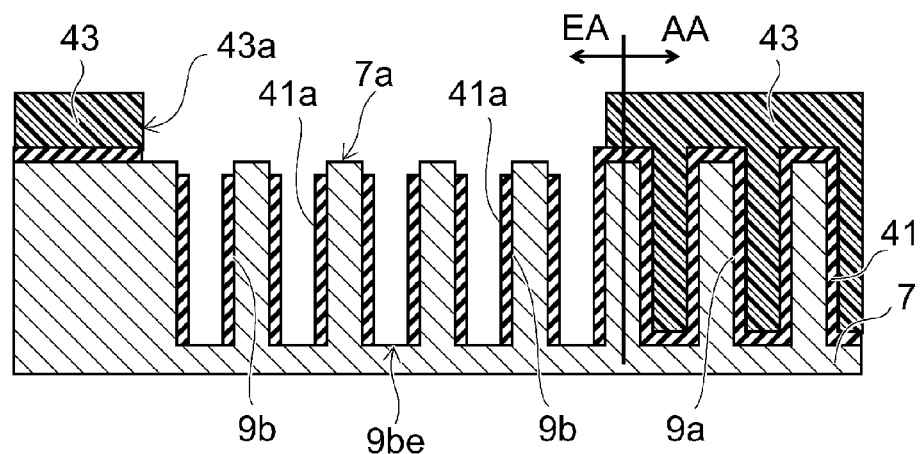
FIGS. 3A to 3C are schematic cross-sectional views depicting the manufacturing processes subsequent to the processes depicted in FIGS. 2A to 2C.
Figure 3B:
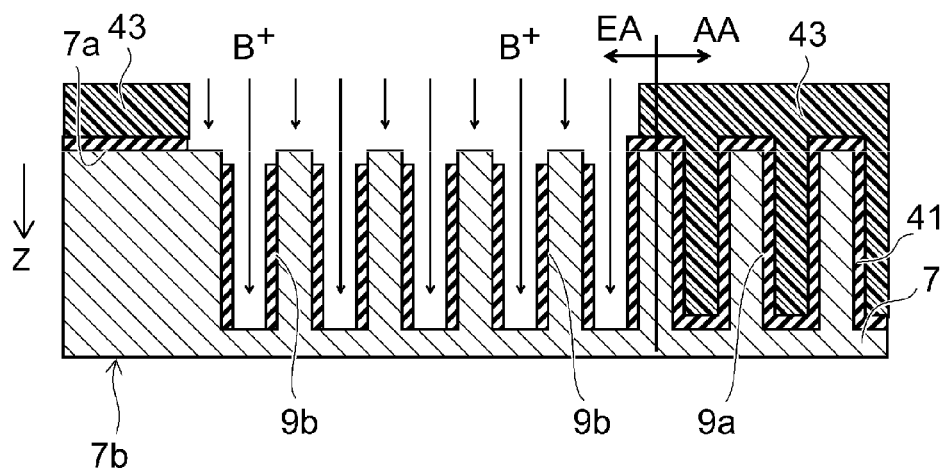

Next, as shown in FIG. 3A, a part of the insulating film 41 which covers a bottom surface 9be of the trenches 9b and the upper surface 7a is removed and a part 41a of the insulating film 41 which covers the inner wall of the trenches 9b is left.

The part of insulating film 41 which covers the bottom surface 9be of the trenches 9b and the upper surface 7a may be removed, for example by using an anisotropic reactive ion etching (RIE) condition (that is an etch condition in which an etching rate in the Z direction is higher than an etching rate in the X direction and Y direction). In this manner, the insulating film 41 exposed by the opening 43a is etched.

Next, via the opening 43a, the p-type dopant ions are implanted into the n-type drift layer 7. The p-type dopant is, for example, boron (B) and implanted into the bottom surface of the trenches 9b and the upper surface 7a of the drift layer 7 from which the insulating film 41 has been removed.

The p-type dopant is implanted into the p-type region 13 formed under the trenches 9b. It is generally, preferable for a lower end of the p-type region to be relatively deep within the drift layer 7. To accomplish this it is possible to increase the channeling component (dopant penetration) in the implantation process by making an effective off-axis angle of an ion implantation beam small during the ion implantation. Specifically, ion implantation is performed such that the effective off-axis angle of the ion beam is smaller than 7 degrees with respect to the Z direction that is an implantation direction, and preferably, 2.7 degrees or smaller. In one embodiment, ion implantation is performed by setting the off-axis angle to 0 (zero) degree.

In addition, the insulating film 41a which covers the inner wall of the trenches 9a serves to suppress implantation of the p-type dopant into the inner wall, and prevents inversion to p-type. Further, the suppression of the off-axis angle in the ion implantation is effective in reducing implantation of the p-type dopant into the inner wall of the trenches 9a. Thus, it is possible to avoid a reduction in the breakdown voltage of the terminal portion EA.

Figure 3C:
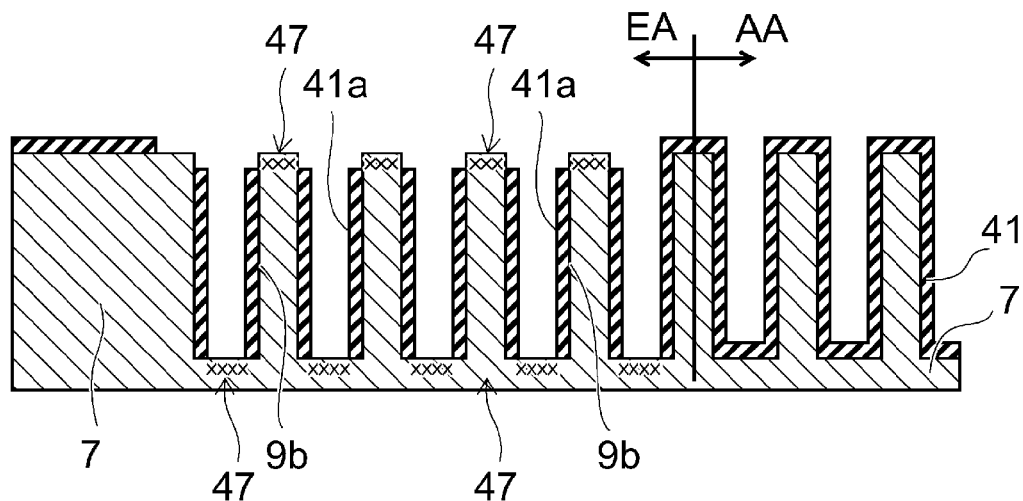

Subsequently, as shown in FIG. 3C, the mask 43 is removed. The mask 43 may be removed by, for example, oxygen asking. Next, the insulating film 41 is etched and removed from the inner surfaces of the trenches 9a and 9b, and the entire upper surface 7a of the drift layer 7.

Next, the insulating film 17 is formed on the inner surfaces of the trenches 9a and 9b, and polysilicon, which is used as the field plate 15 is embedded in the trenches 9a and 9b (refer to FIGS. 1A and 1B). The insulating film 17 may be formed using a silicon thermal oxidization method or a CVD method. In this example, when the insulating film 17 is formed on the inner surfaces of the trenches 9a and 9b using the CVD method, stress may be reduced compared to a case in which the inner surface of each trench is thermally oxidized to form the insulating film 17. As a result of using the CVD method in place of the thermal oxidation method, an effect of suppressing bending of the wafer may be obtained even with thicker insulating films.

Subsequently, the gate insulating film 27, the gate electrode 25, the p-type base layer 21, the n-type source region 23, the interlayer insulating film. 33 and the source electrode 35 are formed in sequence to complete the semiconductor device 1. Through the heat treatment in these additional processes, the dopant 47 (p-type in this example) implanted under the trenches 9b is activated and the p-type region 13 may be formed.

As described above, breakdown voltage of the guard ring structure formed in the terminal portion EA may be enhanced by forming the p-type region 13 under the trench 9b more deeply into the drift layer 7. To do this, a channeling component in the implantation process is increased and the p-type dopant is implanted more deeply by making the off-axis angle small during the p-type dopant ion implantation process.

Figure 4:
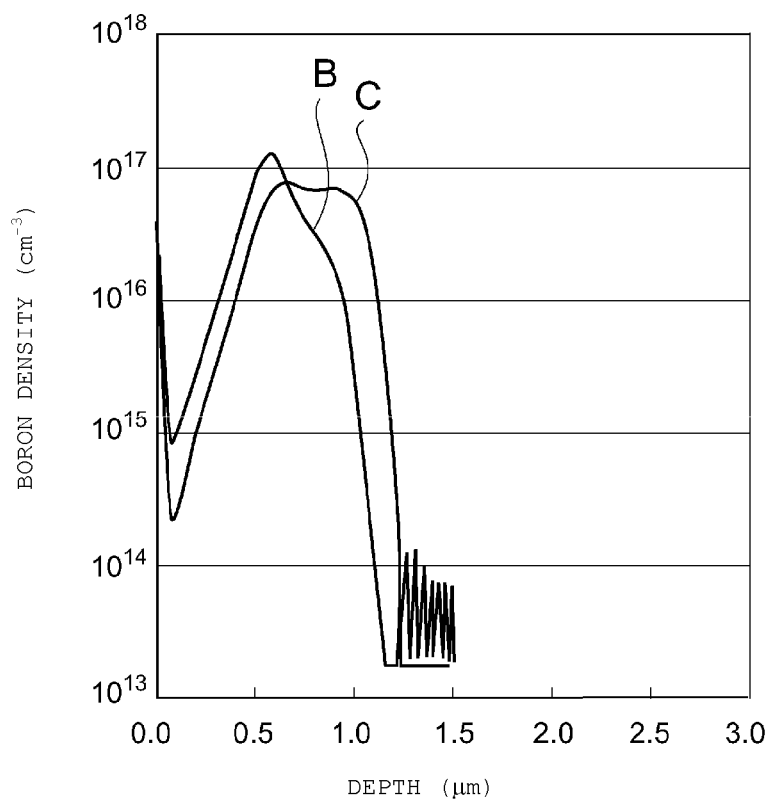
FIG. 4 is a graph showing characteristics of the semiconductor device according to the embodiment.

FIG. 4 is a graph showing dopant implantation characteristics of a semiconductor device according to an embodiment of the present disclosure. Profiles of boron implanted into silicon with different off-axis angles in the ion beam used for dopant implantation are shown. The horizontal axis represents depth (μm) from the surface of the silicon layer, and the vertical axis represents boron density ($cm^{-3}$) in the silicon layer.

A profile B shown in FIG. 4 shows distribution of boron subjected to ion implantation when the off-axis angle is set to 7 degrees. A profile C shows distribution of boron when the off-axis angle is 0 degree. In these profiles, implantation energy is 200 keV, and a dose amount is $4 \times 10^{12}$ $cm^{-3}$.

As apparent from the example shown in FIG. 4, boron is distributed more deeply in the profile C at the off-axis angle of 0 degree than in the profile B at the off-axis angle of 7 degrees. That is, as the off-axis angle becomes smaller than 7 degrees, the channeling component of the ion implantation increases. As a consequence, the dopant may be implanted more deeply into a layer, such as drift layer 7.

For example, when a boron dopant is implanted into a silicon layer having a plane orientation [100] at implantation energy of 100 keV, a channeling critical angle is 2.7 degrees. There is a tendency for the channeling critical angle to decrease as the implantation energy increases. That is, when the ion implantation is performed with high energy, the off-axis angle is preferably 2.7 degrees or less. In addition, a platen of an ion implantation device is preferably set such that a wafer plane angle is perpendicular to the ion beam (that is, the off-axis angle is 0 degree).

In addition, in the above-described manufacturing process, the insulating film 41 is removed from the bottom portion of the trenches 9b exposed in the opening 43a of the mask 43. Thus, the scattering of the dopant ions implanted in the insulating film 41, and thereby a reduction of the channeling component is avoided. That is, a deeper diffusion layer may be formed than if the ion implantation was performed through the insulating film 41. But the insulating film 41a left on the side wall of the trenches 9b serves to suppress a reduction in breakdown voltage of the guard ring which might otherwise be caused by implantation of dopants into the side wall of the trench.

When an ion implantation acceleration voltage is increased to dope the p-type dopant deeply, the implanted ions will tend to be widely scattered. Accordingly, there is a concern that the p-type region 13 formed under the trenches 9b will widened in the horizontal direction (X direction) and even possibly become connected to another p-type region 13 formed under an adjacent trench 9b. When the p-type regions 13 formed under the trenches 9b are connected to each other in the horizontal direction, the potential of all the p-type regions 13 is equal and guard ring performance is deteriorated.

Contrarily, in the embodiment, the ratio of the channeling element is increased to suppress scattering of the implanted ions. Thus, it is possible to avoid connection of the adjacent p-type regions 13. That is, although the semiconductor element structure is miniaturized and an interval between adjacent trenches 9b is decreased, a high breakdown voltage of the guard ring, that is, a high breakdown voltage of the terminal portion, may be maintained.

The p-type region 13 is formed under the trench 9b in the terminal portion EA in the above-describe example, but there is no limitation of the embodiment thereto and the p-type region 13 may be formed under arbitrarily formed trenches in the semiconductor wafer.

For example, trenches extending from the first surface of the first conductivity type semiconductor layer to the second surface are formed and an insulating film which covers the inner surfaces of the trenches is formed. Then, a part of the insulating film formed on bottom surfaces of arbitrary trenches is removed, including in trenches in the terminal portion EA. The second conductivity type dopant ions may be implanted into bottom portions of the trenches at the off angle of the ion beam of smaller than 7 degrees. Thus, a second conductivity type region deeply distributed under the trench may be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   forming a plurality of trenches in a first semiconductor layer of a first conductivity type;
   forming an insulating film on each trench;
   removing a part of the insulating film that is formed on a bottom part of at least a first portion of the plurality of trenches;
   implanting second conductivity type dopant ions into regions of the first semiconductor layer that are below the bottom part of the trenches in the first portion of the plurality of trenches; and
   forming a mask layer to cover a second portion of the plurality of trenches before implanting second conductivity type dopant ions into the regions of the first semiconductor layer that are below the bottom part of the trenches in the first portion of the plurality of trenches.

2. The method according to claim 1, wherein ion implantation with an ion beam having an off-axis angular spread of less than 7 degrees is used in implanting second conductivity type dopant ions.

3. The method according to claim 1, wherein ion implantation with an ion beam having an off-axis angular spread of less than or equal to 2.7 degrees is used in implanting second conductivity type dopant ions.

4. The method according to claim 1, wherein the first portion of the plurality of trenches is in a terminal region of the first semiconductor layer and the second portion of the plurality of trenches is in an element region of the first semiconductor layer.

5. The method according to claim 4, wherein the terminal region surrounds the element region.

6. The method according to claim 1, wherein the second-conductivity type ions are boron ions.

7. The method according to claim 1, wherein the first semiconductor layer comprises silicon.

8. The method according to claim 1, further comprising:
forming a field plate electrode in at least the first portion of the plurality of trenches after implanting second conductivity type dopant ions into the regions of the first semiconductor layer that are below the bottom parts of the trenches in the first portion of the plurality of trenches.

9. A method of manufacturing a semiconductor device, comprising:
forming a plurality of first trenches in a first region of a first semiconductor layer, each first trench having inner surfaces including sidewalls and a bottom surface;
forming a plurality of second trenches in a second region of the first semiconductor layer, the second region surrounded by the first region;
forming an insulating film to cover the inner surfaces of the first trenches;
removing a portion of the insulating film covering the bottom surfaces of the first trenches to thereby expose the bottom surfaces of the plurality of first trenches; and
implanting a dopant into regions of the first semiconductor layer that are not covered by the first insulating film by using an ion beam having an off-axis angular spread of less than 7 degrees.

10. The method according to claim 9, wherein the off-axis angular spread of the ion beam is less than or equal to 2.7 degrees.

11. The method according to claim 9, wherein the first semiconductor layer has a n-type conductivity and the dopant has a p-type conductivity.

12. A method of manufacturing a semiconductor device, comprising:
forming a plurality of first trenches in a first semiconductor layer, each first trench having inner surfaces including sidewalls and a bottom surface;
forming a plurality of second trenches in the first semiconductor layer, each second trench having inner surfaces including sidewalls and a bottom surface;
forming a first insulating film to cover the inner surfaces of the first trenches and the second trenches;
forming a mask layer to cover the plurality of second trenches;
removing a portion of the first insulating film that is covering the bottom surfaces of the plurality of first trenches to thereby expose the bottom surfaces of the plurality of first trenches; and
implanting a dopant into regions of the first semiconductor layer that are not covered by the first insulating film by using an ion beam having an off-axis angular spread of less than 7 degrees.

13. The method according to claim 12, wherein the off-axis angular spread of the ion beam is less than or equal to 2.7 degrees.

14. The method according to claim 12, wherein the first semiconductor layer has a first conductivity type and the dopant has a second conductivity type.

15. The method according to claim 14, wherein the first conductivity type is an n-type conductivity type and the second conductivity type is a p-type conductivity type.

16. The method according to claim 12, wherein the dopant comprises boron ions.

17. The method according to claim 12, wherein the first insulating layer is formed using a chemical vapor deposition process.

18. The method according to claim 12, wherein the plurality of first trenches and the plurality of second trenches are formed at a same time.

* * * * *